US010027328B2

(12) United States Patent
Sharma et al.

(10) Patent No.: US 10,027,328 B2
(45) Date of Patent: Jul. 17, 2018

(54) MULTIPLEXER REDUCTION FOR PROGRAMMABLE LOGIC DEVICES

(71) Applicant: Lattice Semiconductor Corporation, Portland, OR (US)

(72) Inventors: Sunil Sharma, Fremont, CA (US); Venkatesan Rajappan, Fremont, CA (US); Mohan Tandyala, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 71 days.

(21) Appl. No.: 15/073,585

(22) Filed: Mar. 17, 2016

(65) Prior Publication Data

US 2017/0272077 A1    Sep. 21, 2017

Related U.S. Application Data

(60) Provisional application No. 62/217,383, filed on Sep. 11, 2015.

(51) Int. Cl.
*G06F 17/50* (2006.01)
*H03K 19/173* (2006.01)
*H03K 19/177* (2006.01)

(52) U.S. Cl.
CPC ....... *H03K 19/1737* (2013.01); *G06F 17/505* (2013.01); *G06F 17/5054* (2013.01); *H03K 19/17736* (2013.01)

(58) Field of Classification Search
USPC ................................ 320/103, 104, 105, 106
See application file for complete search history.

(56) References Cited

U.S. PATENT DOCUMENTS

| 7,441,105 | B1 * | 10/2008 | Metzgen | G06F 9/3001 |
| | | | | 712/220 |
| 7,506,278 | B1 * | 3/2009 | Rjimati | G06F 17/505 |
| | | | | 716/104 |
| 7,580,824 | B1 * | 8/2009 | Lewis | G06F 17/5036 |
| | | | | 703/14 |
| 2011/0093825 | A1 * | 4/2011 | Baumgartner | G06F 17/504 |
| | | | | 716/108 |

* cited by examiner

*Primary Examiner* — Brian Ngo
(74) *Attorney, Agent, or Firm* — Haynes and Boone, LLP

(57) ABSTRACT

Various techniques are provided to efficiently implement user designs in programmable logic devices (PLDs). In one example, a method includes identifying a multiplexer in the design, identifying one or more irrelevant inputs for the multiplexer by, at least in part, decomposing the select logic into one or more select line binary decision diagrams corresponding to the one or more select lines, and generating a reduced multiplexer by eliminating the one or more irrelevant inputs from the multiplexer. The reduced multiplexer may be used to generate configuration data to configure physical components of the PLD, and the configuration data may be used to program the PLD to conform to the timing constraints of the design and/or PLD.

20 Claims, 9 Drawing Sheets

US 10,027,328 B2

MULTIPLEXER REDUCTION FOR PROGRAMMABLE LOGIC DEVICES

TECHNICAL FIELD

The present invention relates generally to programmable logic devices and, more particularly, to reducing multiplexer structures in programmable logic devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

User designs for PLDs can include one or more multiplexer structures configured to selectively forward one of a plurality of input signals (e.g., a "multiplexer" or "mux" multiplexer structure) or to selectively distribute one input signal across a plurality of outputs (e.g., a "demultiplexer" or "demux" multiplexer structure). Conventional methods for synthesizing and/or mapping multiplexer structures often allocate configurable resources and interconnections in a PLD inefficiently, which can unnecessarily limit the scope of available user designs for a particular size or capability of PLD.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
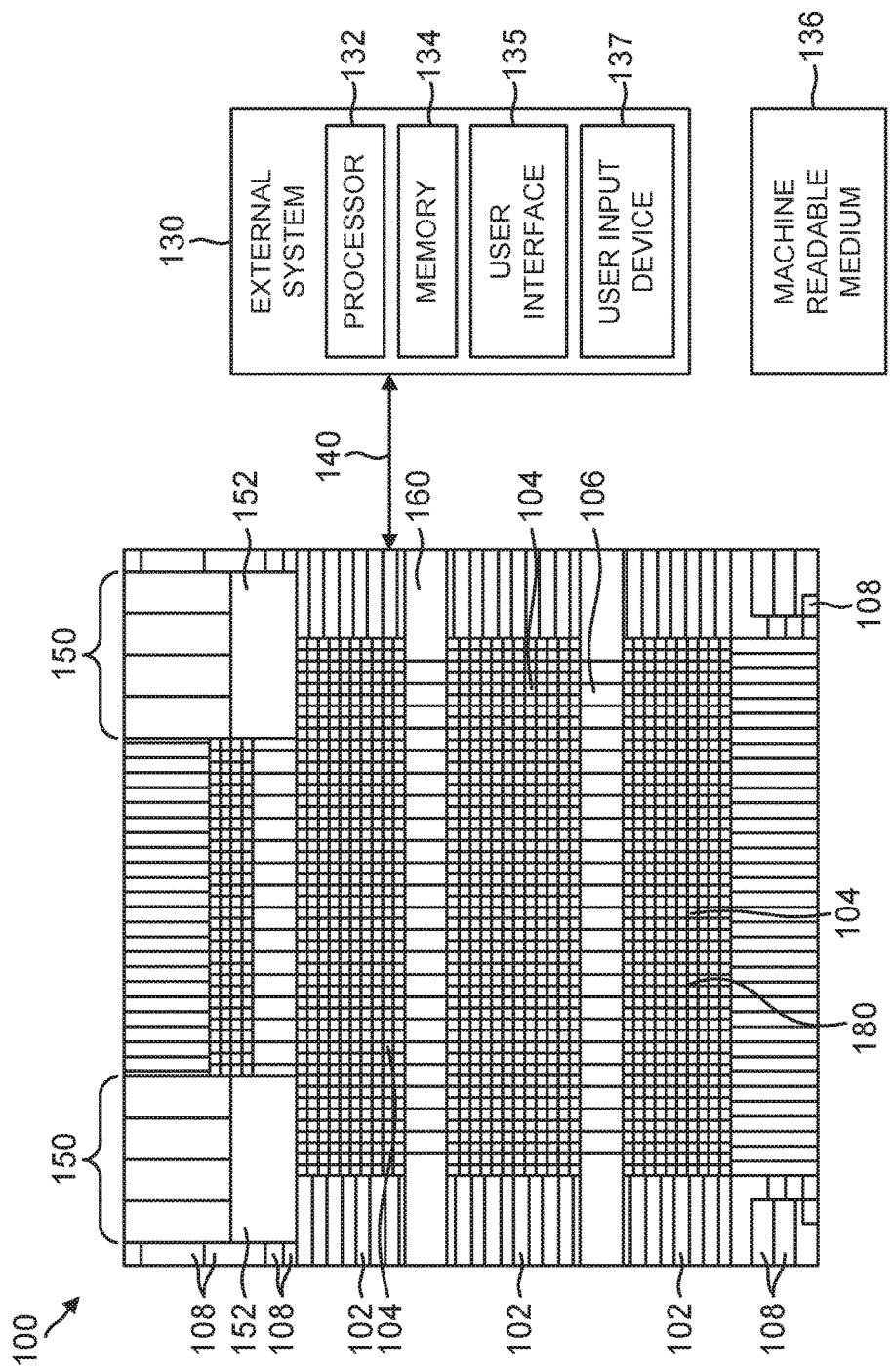
FIG. 1 illustrates a block diagram of a programmable logic device (PLD) in accordance with an embodiment of the disclosure.

In accordance with embodiments set forth herein, techniques are provided to efficiently implement user designs in programmable logic devices (PLDs). In various embodiments, a user/circuit design may be converted into and/or represented by a set of PLD components (e.g., configured for logic, arithmetic, or other hardware functions) and associated interconnections available in a PLD. In general, a PLD (e.g., an FPGA) fabric includes one or more routing structures and an array of similarly arranged logic cells arranged within programmable function blocks (e.g., PFBs and/or PLBs), all driven by clock signals propagated throughout the PLD. The goal in implementing a user design in a particular PLD is to maximize functionality while minimizing area, power, and delay of the fabric.

In various embodiments, a multiplexer synthesis and/or mapping process (e.g., also referred to as an optimization process) may be performed on a user design to reduce consumption of PLD resources and interconnections, which can advantageously reduce overall area, power, and/or delay associated with the design as implemented in a PLD.

In one or more embodiments, a multiplexer or multiplexer structure synthesis and/or mapping process includes identifying one or more multiplexers within a user design which, when a PLD is configured to implement the user design, could be implemented relatively efficiently using the methods described herein. For example, such optimization process may include generating reduced multiplexers by analyzing select logic to identify irrelevant inputs (e.g., "don't care" inputs) that do not change or affect the outputs of the identified multiplexers during operation of the overall user design. The irrelevant inputs and/or any corresponding circuitry may be eliminated from the user design (e.g., grounded/terminated or removed) to reduce the amount of PLD resources (e.g., PLD components and/or routing resources) necessary to implement the user design.

In various embodiments, the select logic for a multiplexer may be analyzed efficiently by decomposing the select logic into a set of binary decision diagrams (BDDs). BDDs, also referred to as branching programs, are data structures that can be used to represent logic functions in a compressed form. Typically, BDDs are generated in a reduced and/or ordered form (e.g., ROBDDs), and various logic operations (e.g., conjunction, negation, and/or other logic operations) can be performed on BDDs without necessitating decompression or new decompositions of the source logic (e.g., the select logic).

In embodiments of the present disclosure, the select logic for a multiplexer may be decomposed into a set of BDDs, typically one BDD for each select line controlling operation of the multiplexer, and the set of BDDs may be combined to determine the BDD for each input. If the BDD for an input evaluates to constant zero (e.g., logic low), then that input (and any corresponding circuitry) is irrelevant to the operation of the multiplexer/structure and can be eliminated from the multiplexer and/or from the user design without negatively impacting operation of the user design. Once the irrelevant circuitry is eliminated from the multiplexer, the resulting structure may be referred to as a reduced multiplexer. Such irrelevant circuitry may include, for example, various PLD components, routing resources, other user design structures, and/or various multiplexer substructures (e.g., substructures of a multiplexer structure), including portions of the select logic for the multiplexer, substructure multiplexers (e.g., one or more relatively small multiplexer structures chained together in parallel and/or serially to form a larger multiplexer structure), and/or interconnections between multiplexer substructures.

In embodiments where BDD analysis of the select logic is employed, the complexity of the analysis is substantially less than brute force methods and, in some embodiments, can scale substantially linearly with the complexity of the multiplexer itself. For example, the complexity of determining irrelevant inputs using exhaustive search methods (e.g., brute force), where each individual full input vector is used in conjunction with a netlist for the multiplexer to calculate corresponding outputs (e.g., that are then evaluated to determine if they are constant zero/logic low), is typically exponential in the number of inputs N to the select logic (e.g., the exhaustive search complexity is ~$O(2^N)$, and requires ~$2^N$ iterations). As such, the complexity of the exhaustive search method does not scale well with the complexity of the user design and can significantly increase the time and processing resources needed to generate a reduced multiplexer and to synthesize and map user designs into configurable resources for a PLD. Moreover, the calculations typically must be done for each select line for the multiplexer, and there typically is no reuse of commutation or other complexity mitigating technique. As such, exhaustive search methods may be limited to use when the complexity of the multiplexer is relatively low (e.g., when N is less than a predetermined value for N, such as 4, 8, 10, 12, and/or any combination of powers of 2, depending on available computational resources).

By contrast, the complexity of performing the BDD decomposition of the select logic is roughly linear with the number of decision or logic or operation nodes M for each select line of the select logic (e.g., ~$O(M)$, and the complexity of evaluating the BDDs for each input, which is decoupled from the BDD decomposition of the select logic (e.g., the complexities add rather than multiply), is roughly linear with the number of select lines P of the multiplexer (e.g., ~$O(P)$). M is roughly a measure of the complexity of the select logic, and P is roughly a measure of the complexity of the non-select-logic portion of the multiplexer, and so the overall BDD analysis scales roughly linearly with the complexity of the overall multiplexer (e.g., ~$O(M)+O(P)$). Moreover, the BDDs may include one or more sub-BDDs (e.g., used to represent a logic or operation node or subset of logic or operation nodes in the select logic) that can be reused to decompose similar or shared logic within the select logic of a particular multiplexer. As such, the complexity of the BDD analysis, as described herein, substantially scales with the complexity of the user design and can significantly reduce the time and processing resources needed to generate a reduced multiplexer and to synthesize and map user designs into configurable resources for a PLD, as compared to alternative methods.

Once a reduced multiplexer is determined, that reduced multiplexer may be used to synthesize and/or map the multiplexer into a corresponding reduced number of PLD components and/or arrangement of PLD components. For example, as a result of such process (e.g., optimization), a multiplexer can be implemented relatively efficiently, thereby freeing up configurable PLD components that would otherwise be occupied by additional inputs, outputs, select logic, and/or various other multiplexer substructures. In addition, the reduced multiplexer can be determined without requiring an exhaustive search of all possible states of the multiplexer, which would otherwise overtax or overrun available computing resources. Furthermore, in some embodiments, the overall propagation delay of the reduced multiplexer may also be reduced, which in some cases may advantageously permit an increase in the clock frequency of a PLD configured with the reduced multiplexer, relative to PLDs configured with non-reduced multiplexers.

In some embodiments, the user design, the converted user design, and/or the optimized user design may be represented by a netlist that identifies various types of components provided by the PLD, their associated signals, and/or their interconnections. In embodiments that produce a netlist of the user design, the optimization process may be performed on such a netlist. The netlist may be used to place components and/or route connections for the design (e.g., using routing resources of the PLD) with respect to a particular PLD (e.g., using a simulation of the desired circuit design constructed from the netlist).

Referring now to the drawings, FIG. 1 illustrates a block diagram of a PLD 100 in accordance with an embodiment of the disclosure. In various embodiments, PLD 100 may be implemented as a standalone device, for example, or may be embedded within a system on a chip (SOC), other logic devices, and/or other integrated circuit(s). PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs) or block (PFBs), or programmable logic cells (PLCs)).

I/O blocks 102 provide I/O functionality (e.g., to support one or more I/O and/or memory interface standards) for PLD 100, while programmable logic blocks 104 provide logic functionality (e.g., look up table (LUT) based logic or logic gate array based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock driver sources, PLL circuits, DLL circuits, and/or feedline interconnects), and/or various routing resources (e.g., interconnects and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

In another example, routing resources (e.g., routing resources 180 of FIG. 2) may be used to route connections between components, such as between I/O nodes of logic blocks 104. In some embodiments, such routing resources may include programmable elements (e.g., nodes where multiple routing resources intersect) that may be used to selectively form a signal path for a particular connection between components of PLD 100.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may store such configuration data to memory 134 and/or machine readable medium 136, and/or pro'vide such configuration data to one or more I/O blocks 102, memory blocks 106, SERDES blocks 150, and/or other portions of PLD 100. As a result, programmable logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100. In some embodiments, user interface 135 may be adapted to display a netlist, a component placement, a connection routing, hardware description language (HDL) code, and/or other final and/or intermediary representations of a desired circuit design, for example.

Figure 2:
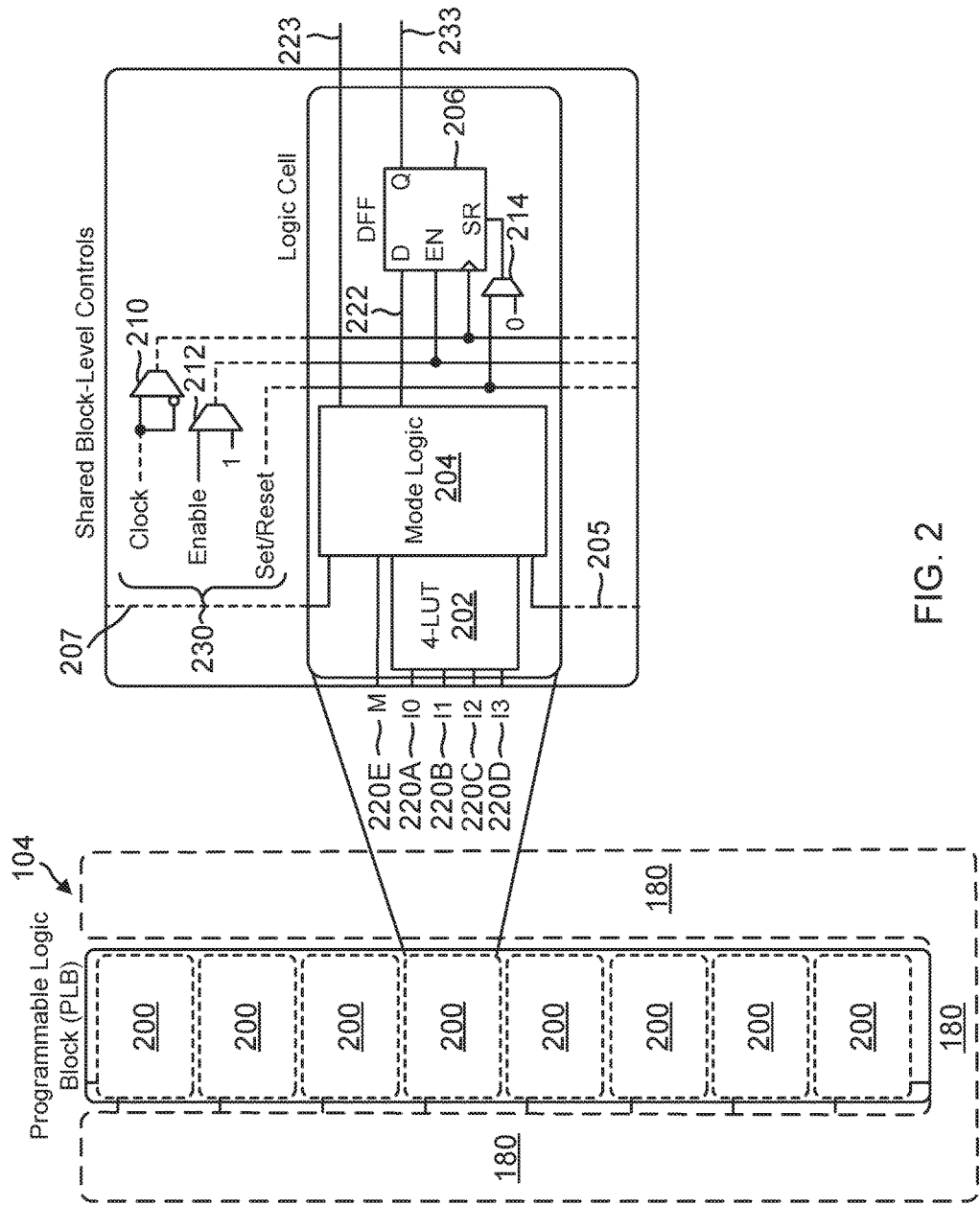
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality, which can also be used to implement clock signal processing and/or functionality (e.g., a clock, a clock divider, a clock signal delay, a clock signal propagator, and/or other clock signal processing and/or functionality), and which can also be used to implement multiplexer structures, as described herein.

In the example embodiment shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 212 and 214) for selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. For example, LUT 202 (e.g., in the form of a 4-LUT) may be configured to implement a 2-1 multiplexer, as described herein. Mode logic 204 may include various logic elements and/or additional inputs, such as input 220E, to support the functionality of various modes for logic cell 200 (e.g., including various clock signal processing and/or functionality modes). LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 and/or mode logic 204 may in some embodiments be passed through register 206 to provide an output signal 233 of logic cell 200. In various embodiments, an output signal 223 from LUT 202 and/or mode logic 204 may be passed to output 223 directly, as shown. Depending on the configuration of multiplexers 210-214 and/or mode logic 204, output signal 222 may be temporarily stored (e.g., latched) in latch 206 according to control signals 230. In some embodiments, configuration data for PLD 100 may configure output 223 and/or 233 of logic cell 200 to be provided as one or more inputs of another logic cell 200 (e.g., in another logic block or the same logic block) in a staged or cascaded arrangement (e.g., comprising multiple levels) to configure logic and/or other operations that cannot be implemented in a single logic cell 200 (e.g., operations that have too many inputs to be implemented by a single LUT 202). Moreover, logic cells 200 may be implemented with multiple outputs and/or interconnections to facilitate various selectable modes of operation, as described herein.

Mode logic circuit 204 may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, multiplexer, demultiplexer, and/or other selectable modes of operation. In this regard, mode logic circuits 204, across multiple logic cells 202, may be chained together to pass carry-in signals 205 and carry-out signals 207, and/or other signals (e.g., output signals 222) between adjacent logic cells 202, as described herein. In the example of FIG. 2, carry-in signal 205 may be passed directly to mode logic circuit 204, for example, or may be passed to mode logic circuit 204 by configuring one or more programmable multiplexers. In some embodiments, mode logic circuits 204 may be chained across multiple logic blocks 104.

Logic cell 200 illustrated in FIG. 2 is merely an example, and logic cells 200 according to different embodiments may include different combinations and arrangements of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

Figure 3:
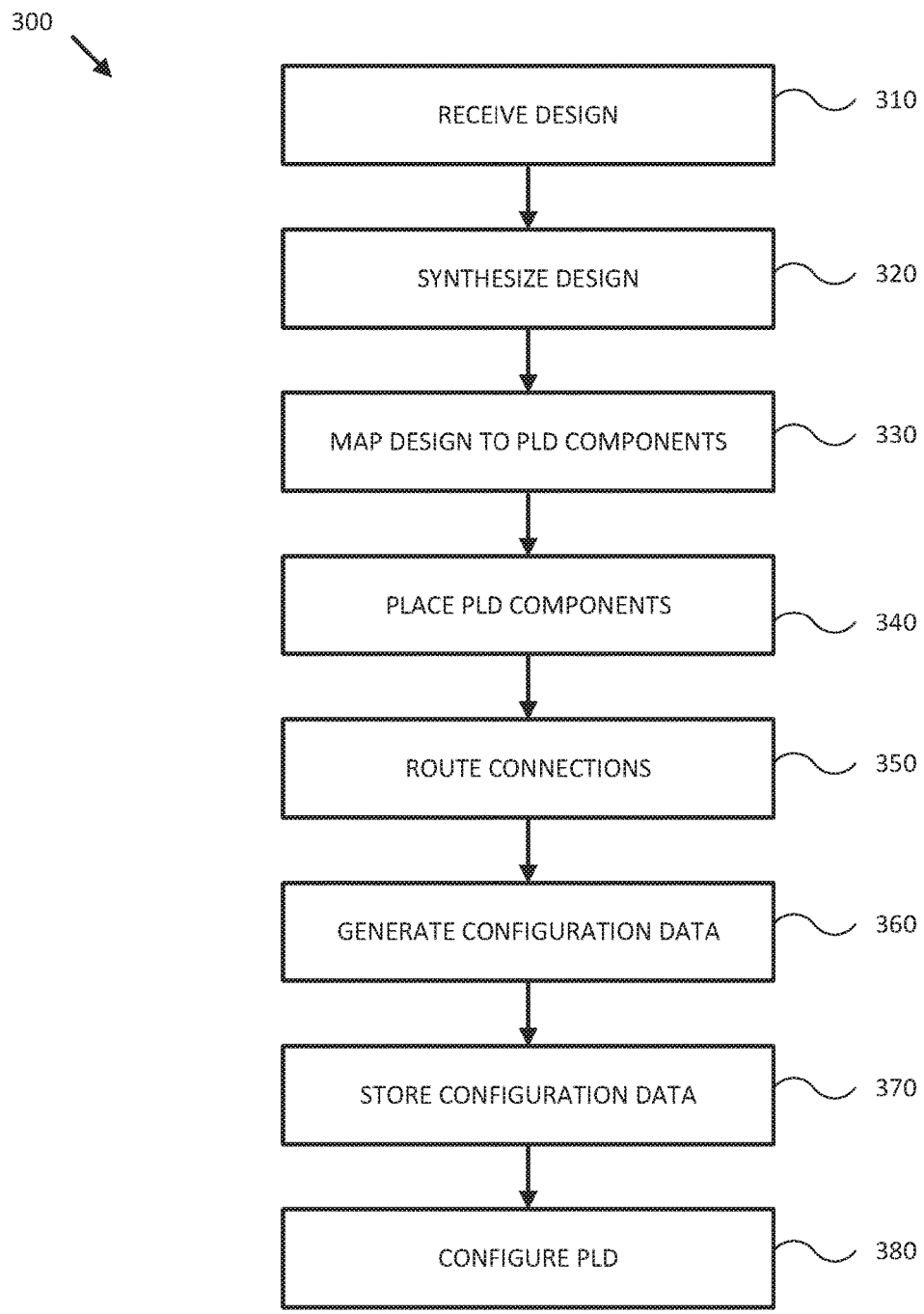
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software and/or other configuration application to configure PLD 100. In some embodiments, the various files and information referenced in FIG. 3 may be stored, for example, in one or more databases and/or other data structures in memory 134, machine readable medium 136, and/or otherwise.

In block 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may also perform one or more rule checks to confirm that the user design describes a valid configuration of PLD 100. For example, system 130 may reject invalid configurations and/or request the user to provide new design information as appropriate.

In block 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored according to a particular file format, such as Electronic Design Interchange Format (EDIF) in a Native Generic Database (NGD) file.

In some embodiments, synthesizing the design into a netlist in block 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals In some embodiments, synthesizing the design into a netlist in block 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing multiplexers and/or multiplexer structures identified in a user design. For example, the optimization process may include identifying irrelevant inputs for a multiplexer structure in the design and generating a reduced multiplexer structure by eliminating the irrelevant inputs to reduce the number of PLD components and/or routing resources used to implement the multiplexer structure and/or to reduce the propagation delay associated with the multiplexer structure.

In block 330, system 130 performs a mapping process that identifies components of PLD 100 that may be used to implement the user design. In this regard, system 130 may map the optimized netlist (e.g., stored in block 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored files, with the mapping results stored as a physical design file (e.g., also referred to as an NCD file).

In block 340, system 130 performs a placement process to assign the mapped netlist components to particular physical components residing at specific physical locations of the PLD 100 (e.g., assigned to particular logic cells 200, logic blocks 104, clock-related circuitry 108, routing resources 180, and/or other physical components of PLD 100), and thus determine a layout for the PLD 100. In some embodiments, the placement may be performed in memory on data retrieved from one or more previously-stored files, for example, and/or on one or more previously-stored files, with the placement results stored (e.g., in memory 134 and/or machine readable medium 136) as another physical design file.

In block 350, system 130 performs a routing process to route connections (e.g., using routing resources 180) among the components of PLD 100 based on the placement layout determined in block 340 to realize the physical interconnections among the placed components. In some embodiments, the routing may be performed in memory on data retrieved from one or more previously-stored files, for example, and/or on one or more previously-stored files, with the routing results stored (e.g., in memory 134 and/or machine readable medium 136) as another physical design file.

In various embodiments, routing the connections in block 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing multiplexers/multiplexer structures identified in a user design. For example, the optimization process may include identifying irrelevant inputs for a multiplexer in the design and generating a reduced multiplexer by eliminating the irrelevant inputs to reduce the number of PLD components and/or routing resources used to implement the multiplexer and/or to reduce the propagation delay associated with the multiplexer.

Changes in the routing may be propagated back to prior operations, such as synthesis, mapping, and/or placement, to further optimize various aspects of the user design.

Thus, following block 350, one or more physical design files may be provided which specify the user design after it has been synthesized (e.g., converted and optimized), mapped, placed, and routed (e.g., further optimized) for PLD 100 (e.g., by combining the results of the corresponding previous operations). In block 360, system 130 generates configuration data for the synthesized, mapped, placed, and routed user design.

In block 370, the configuration data is stored for subsequent use by PLD 100. For example, in some embodiments, the configuration data generated in block 360 is stored in a non-volatile machine-readable memory (e.g., within PLD 100 itself or external to PLD 100 such as in machine-readable medium 136). When PLD 100 is started (e.g., powered on), the configuration data may be loaded from the non-volatile memory into appropriate volatile memory of PLD 100 to configure PLD 100 for use. In other embodiments, the configuration data may be stored by external system 130 and/or machine-readable medium 136 and loaded (e.g., in the form of a configuration data bitstream over connection 140) into appropriate volatile memory of PLD 100 when PLD is started. In block 380, PLD 100 is configured and operated in accordance with the previously stored configuration data. As a result, PLD 100 may be operated in accordance with the user design.

Figure 4:
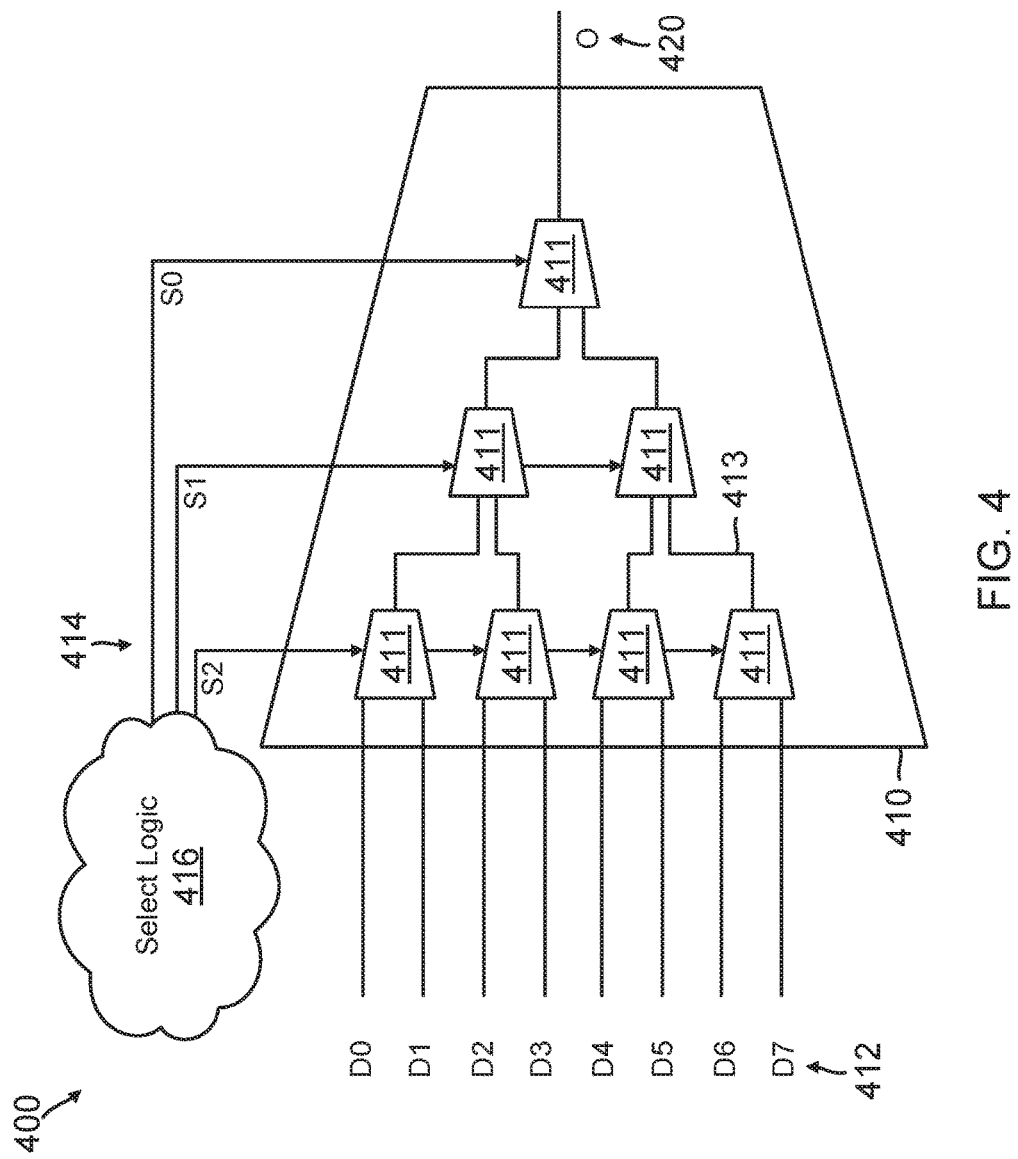
FIG. 4 illustrates a multiplexer to be implemented in a PLD in accordance with an embodiment of the disclosure.

Multiplexer design reduction may be implemented by identifying the multiplexer structure and different portions of the multiplexer structure within a design (e.g., using user design identifiers and circuit tracing techniques, for example) and analyzing those different portions to help eliminate irrelevant inputs and/or associated circuitry. For example, FIG. 4 illustrates a design portion/multiplexer 400 to be implemented in a PLD in accordance with an embodiment of the disclosure. In various embodiments, design portion/multiplexer 400 may diagrammatically represent a portion of a user design (e.g., presented in HDL code, a netlist, and/or other format for a user design) to be implemented in an embodiment of PLD 100.

In the embodiment presented by FIG. 4, design portion 400 includes 8-1 multiplexer 410 implemented by seven 2-1 substructure multiplexers 411 interconnected by interconnections 413, and select logic 416 configured to control multiplexer 410 over select lines 414 (S0, S1, and S2) to receive data inputs 412 (D0-D7) and provide output 420 (O), as shown. In various embodiments, each element of design portion 400 may be represented in HDL code, a netlist, and/or other format for a user design, as described herein.

In various embodiments, the set of functional relationships between inputs 412, output 420, and the logic states of select lines 414 may be referred to as select line relations for multiplexer 410. For example, in the specific embodiment provided in FIG. 4, for output O to be D0, each of S0, S2, and S3 should be logic low (e.g., D0: S0'.S1'.S2'; where "'" indicates logic low and where "." represents the logic AND operator); for output O to be D1, S0 and S1 should be logic low, and S2 should be logic high (e.g., D1: S0'.S1',S2), and so on for each data input 412. More generally, a set of select line relations between inputs 412 and output 420 may be determined (e.g., by system 130) for any particular arrangement of select lines 414 and substructure multiplexers 411 implementing multiplexer 410. As noted herein, a multiplexer optimization process can include decomposing select logic 416 into a set of select line BDDs corresponding to select lines 414. Once select logic 416 is decomposed into the set of select line BDDs, the set of select line relations may be used to combine the individual select line BDDs to determine an input BDD for each data input 412.

Figure 5:
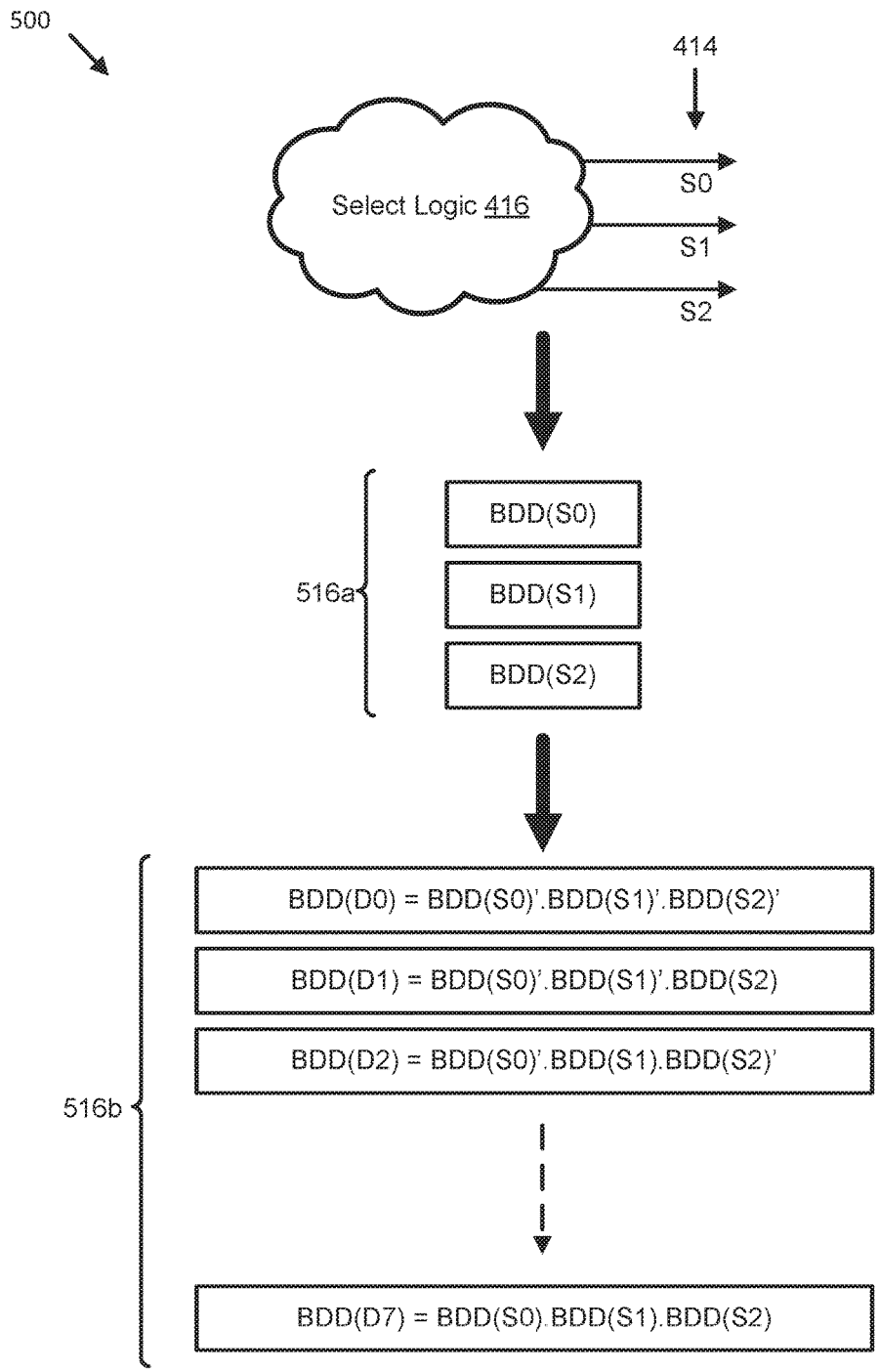
FIG. 5 illustrates an overall flow of a multiplexer reduction process for a PLD in accordance with an embodiment of the disclosure.

As an example, FIG. 5 illustrates a multiplexer reduction process 500 for a PLD in accordance with an embodiment of the disclosure. At the top of process 500, system 130 has identified select logic 416 and select lines 414 of multiplexer 410 in FIG. 4. Next, a set of select line BDDs 516a representing select logic 416 and select lines 414 (e.g., BDD(S0), BDD(S1), BDD(S2)) may be determined from the particular selection and arrangement of logic and circuitry within select logic 416 and/or select lines 414, as described herein. Then, as described herein, the particular arrangement of select lines 414 and substructure multiplexers 411 in FIG. 4 may be used to determine a set of select line relations for multiplexer 410, and those select line relations may be used to combine the select line BDDs to determine a set of input BDDs 516b for data inputs 412 (e.g., BBD(D0)-BDD(D7), as shown in FIG. 5, where "'" represents the logic negation or inversion operator and "." represents the logic AND operator, both of which may be performed on the select line BDDs without necessitating decompression or new decompositions of select logic 416, as described herein). Once input BDDs 516b are determined, any input BDD 516b evaluated as constant zero/logic low indicates that its corresponding data input 412 is irrelevant (e.g., don't care) and can be eliminated from the user design.

Figure 6:
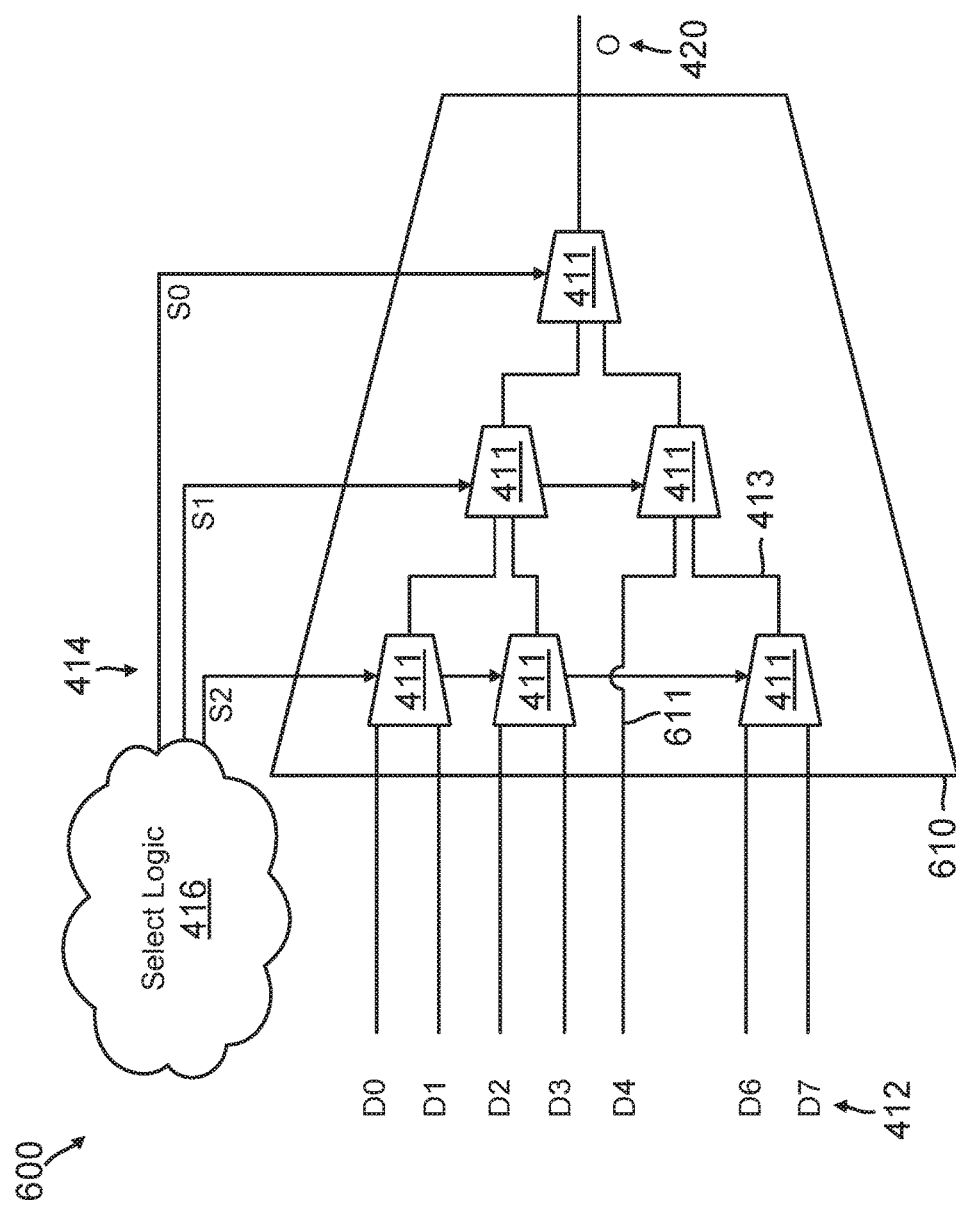
FIG. 6 illustrates a reduced multiplexer in accordance with an embodiment of the disclosure.

FIG. 6 illustrates design portion/reduced multiplexer 600, which in some embodiments may be design portion/multiplexer 400 of FIG. 4 after being reduced in accordance with an embodiment of the disclosure. As shown in FIG. 6, an input BDD corresponding to D5 of data inputs 412 has been evaluated to constant zero (e.g., for all possible states of select logic 416, BDD(D5)=logic low) during steps 320-340 of design process 300, for example, and input D5 and any associated circuitry has been removed from the user design (e.g., from design portion 400). In some embodiments, input D5 may be terminated or grounded near or at reduced multiplexer 610. In other embodiments, as shown in FIG. 6, input D5 may be removed from reduced multiplexer 610 and the corresponding substructure multiplexer 411 may be replaced with routing circuitry 611, as shown.

In some embodiments, select logic 414 of FIG. 4 may also be reduced to produce select logic 616, as shown in FIG. 6. As an example, in embodiments where each of inputs D1, D3, and D7 are determined to be irrelevant to operation of reduced multiplexer 610 (e.g., using process 500 of FIG. 5), each of the substructure multiplexers 411 coupled to select line S2 may be eliminated from multiplexer 610. In addition, select line S2 and any associated logic and/or circuitry within select logic 616 that controls operation of select line S2 and is not shared with logic controlling operation of the remaining select lines (e.g., S0 and S1) may also be eliminated from design portion 600. As a result, design portion/reduced multiplexer 600 may reduce the overall area, power, and delay associated with the user design as implemented in a PLD, relative to design portion/multiplexer 400.

Figure 7:
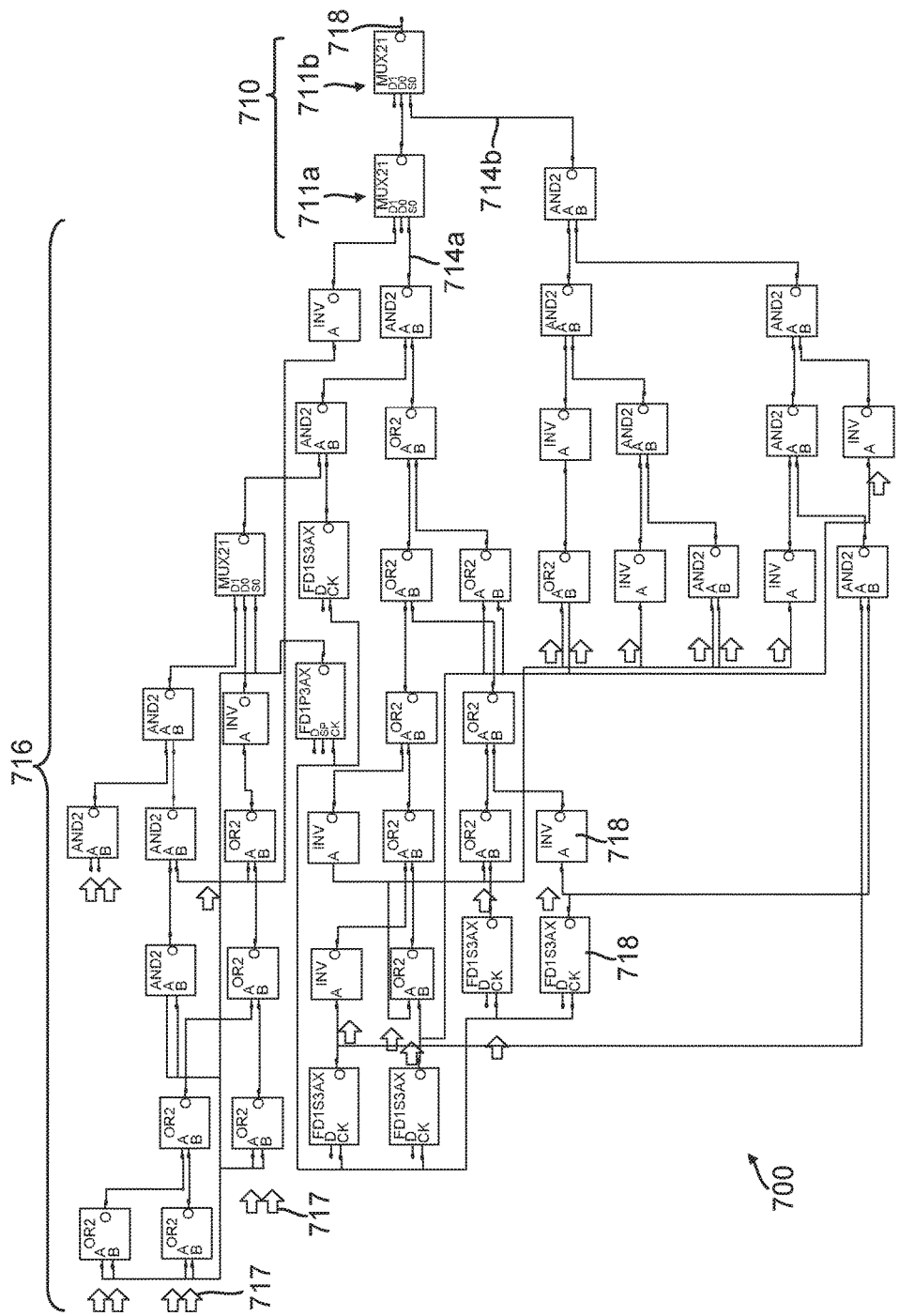
FIG. 7 illustrates a multiplexer to be implemented in a PLD in accordance with an embodiment of the disclosure.

FIG. 7 illustrates a design portion/multiplexer 700 to be implemented in a PLD in accordance with an embodiment of the disclosure. In the embodiment provided by FIG. 7, design portion 700 includes multiplexer 710 implemented by substructure multiplexers 711a and 711b and controlled by select logic 716 over select lines 714a and 714b to provide output 720. Also shown in FIG. 7 are select logic inputs 717 (e.g., the various arrow outlines in FIG. 7) and logic/operation nodes 718 of select logic 716. In various embodiments, select logic inputs 717 may be provided by I/O blocks 102, data inputs to design portion 700 (e.g., similar to data inputs 412 of multiplexer 410 in FIG. 4), and/or other portions of a user design. Operation nodes 718 may include any resistor-transistor logic primitives and/or other logic primitives (e.g., OR, NOR, AND, NAND, INV, etc.) and may in some embodiments include various logic operators (e.g., adder, Less Than, etc.), all of which can be decomposed into BDDs, as described herein. In some embodiments, and as shown in FIG. 7, some operation nodes 718 may be shared between select lines 714a and 714b, such that the shared operation nodes control, at least in part, operation and/or logic states of both select lines 714a and 714b.

In embodiments where select logic analysis performed as described herein indicates one of select lines 714a and 714b is determined to be irrelevant to operation of design portion 700 (e.g., where for example all data inputs for the corresponding substructure multiplexer are irrelevant to operation of multiplexer 710), that select line and any unshared associated inputs 717, operation nodes 718, and/or other circuitry within select logic 716 may be eliminated from design portion 700. In embodiments where all select lines are determined to be irrelevant, all of select logic 716 may be eliminated from design portion 700, for example, and/or design portion/multiplexer 700 may itself be eliminated (e.g., removed from the user design and/or replaced with routing between the remaining relevant input and output 720) to reduce the amount of PLD resources (e.g., PLD components and/or routing resources) necessary to implement the user design.

Figure 8:
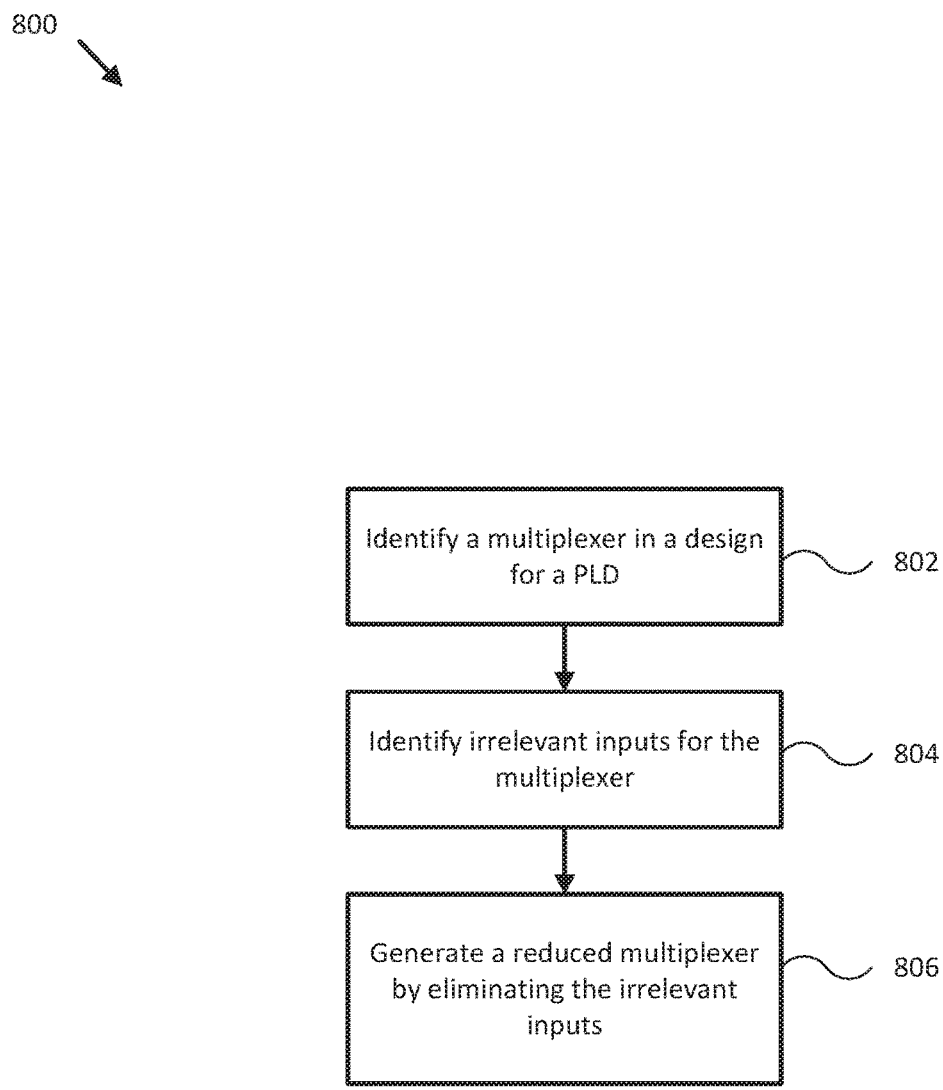
FIG. 8 illustrates a multiplexer reduction process for a PLD in accordance with an embodiment of the disclosure.

FIG. 8 illustrates a multiplexer reduction process 800 for a PLD in accordance with an embodiment of the disclosure. For example, the process of FIG. 8 may be performed by system 130 running Lattice Diamond software to configure PLD 100, as discussed with respect to FIG. 3. More specifically, FIG. 8 illustrates an embodiment of the present disclosure where operations 320-350 of FIG. 3 may include operations 802, 804, and 806 representing a multiplexer synthesis and/or mapping process, as described herein. In various embodiments, any one or more of operations 802, 804, and 806 may be omitted from process 800.

In operation 802, system 130 identifies a multiplexer in a design. For example, system 130 may be configured to parse a user design for PLD 100 that is stored in memory 134 and/or machine readable medium 136 (e.g., as HDL code, a netlist, and/or other user design formats) and identify one or more multiplexers 400 within the design, including any select logic 416 configured to control operation of multiplexer 410 and any corresponding select lines 414, as described herein. In various embodiments, system 130 may be configured to parse an entire user design to identify all multiplexers within the user design before proceeding to operation 804, for example, or system 130 may be configured to proceed to operation 804 upon identification of one or a predefined number (e.g., by user setting, or according to available computing resources of system 130) of multiplexers within a user design.

In operation 804, system 130 identifies irrelevant inputs for a multiplexer. For example, system 130 may be configured to identify one or more irrelevant inputs (e.g., data input D5 in FIG. 4, compare FIG. 6) for multiplexer 410 identified in operation 802 by, at least in part, decomposing select logic 416 for the identified multiplexer 410 into one or more select line BDDs corresponding to select lines 414 of select logic 416, as described herein.

In some embodiments, system 130 may be configured to first estimate a complexity of multiplexer 410 before selecting a process to identify irrelevant inputs. For example, system 130 may be configured to estimate the complexity of multiplexer 710 based on the number of select logic inputs 717 to select logic 716 of multiplexer 710 (e.g., "N" as used herein), the number of operation nodes 718 for each select line 714a, 714b of select logic 716 (e.g., "M" as used herein), the number of select lines 714a, 714b of multiplexer 710 (e.g., "P" as used herein), and/or any combination of those. For multiplexers with relatively low complexity less than a predetermined value (e.g., N, M, and/or P less than one or more corresponding predetermined values and/or a combined predetermined value, based on user settings and/or available computational resources, for example), system 130 may be configured to identify irrelevant inputs using an exhaustive search method, as described herein. For multiplexers with relatively high complexity equal to or greater than the predetermined value (e.g., N, M, and/or P greater than or equal to the one or more corresponding predetermined values and/or a combined predetermined value), system 130 may be configured to identify irrelevant inputs using BDD decomposition, as described herein.

In operation 806, system 130 generates a reduced multiplexer by eliminating irrelevant inputs. For example, system 130 may be configured to generate reduced multiplexer 610 by eliminating irrelevant inputs (e.g., data input D5 of FIG. 4) and/or any corresponding circuitry (e.g., one of substructure multiplexers 411 in FIG. 4) identified in operation 804. In some embodiments, system 130 may eliminate a data input by terminating or grounding the data input at or within multiplexer 410, for example, or by removing the data input and any related circuitry (e.g., corresponding to various PLD components and/or routing resources) in the user design. Such process may also include eliminating various multiplexer substructures, such as portions of select logic 416 for multiplexer 410, one or more corresponding select lines 414, one or more substructure multiplexers 411, and/or interconnections 413 between multiplexer substructures, as described herein.

By eliminating such irrelevant inputs and related circuitry, embodiments of the present disclosure are able to reduce the number of PLD components necessary to implement the user design without degrading or otherwise negatively impacting operation of the user design. Moreover, in some embodiments, generation of reduced multiplexers, as described herein, may increase the achievable performance of the user design by eliminating potential propagation delays associated with propagation of signals along an eliminated input and/or associated circuitry.

Figure 9:
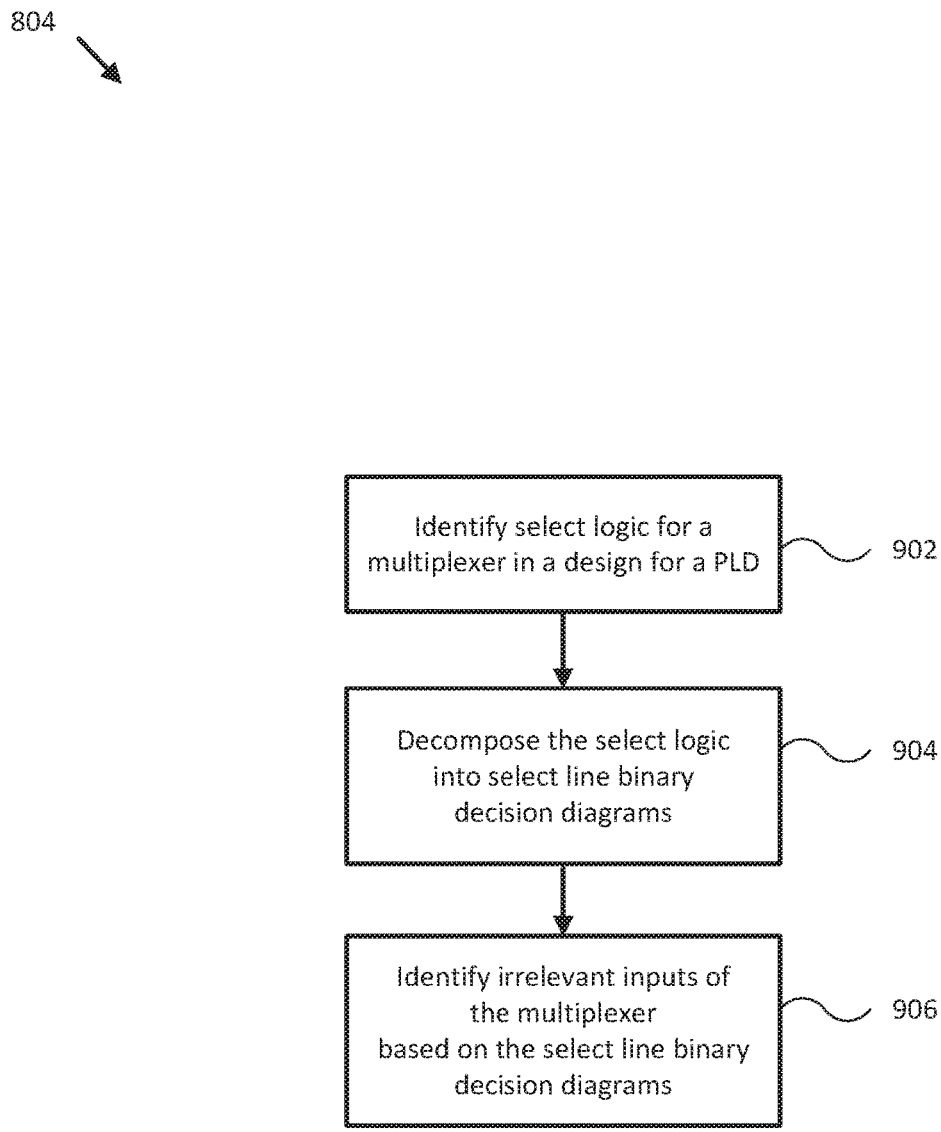
FIG. 9 illustrates a multiplexer reduction process for a PLD in accordance with an embodiment of the disclosure.

FIG. 9 illustrates a multiplexer reduction process 804 for a PLD in accordance with an embodiment of the disclosure. For example, the process of FIG. 9 may be performed by system 130 running Lattice Diamond software to configure PLD 100, as discussed with respect to FIG. 3. More specifically, FIG. 9 illustrates an embodiment of the present disclosure where operations 320-350 of FIG. 3 and/or operation 804 of FIG. 8 may include operations 902, 904, and 906 representing a multiplexer synthesis and/or mapping process, as described herein. In various embodiments, any one or more of operations 902, 904, and 906 may be omitted from process 900.

In operation 902, system 130 identifies select logic for a multiplexer in a design. For example, system 130 may be configured to parse design portion 400 identified in operation 802 of FIG. 8 to identify select logic 416 of multiplexer 410. In some embodiments, system 130 may be configured to trace select lines 414 of multiplexer 410 back through the user design to originating signal sources (e.g., select logic inputs 717), such as those corresponding to I/O blocks 102, outputs 420 of other multiplexer structures, select logic inputs 717, and/or other circuitry described in a user design.

In such embodiments, the select logic may include resistor-transistor primitives, other logic operations, and/or other functional operations, in addition to select logic inputs 717.

In various embodiments, system 130 may be configured to limit the extent and/or estimated complexity of the identified select logic (e.g., which can also limit the absolute effectiveness of the optimization process), to limit the memory and/or computational time used to perform the design process. For example, system 130 may be configured to trace select lines 714a, 714b of multiplexer 710 back through the user design up to a predefined maximum number of identified select logic inputs 717 (e.g., Nmax, as used herein) and/or a predefined maximum total number of identified decision or logic or operation nodes 718 (e.g., Mmax, as used herein), which may include predefined individual maximums for each select line 714a, 714b and/or predefined overall maximums for all the select lines in aggregate.

For example, as seen in FIG. 7, each of operation nodes 718 may accept one, two, or more inputs for each output, system 130 may be configured to limit the identified select logic (e.g., the select logic to be analyzed in order to identify irrelevant inputs, as described herein) according to predefined maximums by select line and/or by the aggregate of all select lines. In some embodiments, system 130 may iteratively trace back each select line 714a, 714b, through a single operation node 718 per iteration, and alternating through each select line 714a, 714b, until the predefined maximum(s) are reached. In other embodiments, system 130 may be configured to identify all shared logic within select logic 716 (e.g., logic or functional nodes that control the logic states of more than one select line of the multiplexer structure) regardless of the predefined maximums. In other embodiment, system 130 may be configured to preferentially allocate a relatively large percentage (e.g., 60-90%) of the available predefined maximums to identify shared logic yet stay within the predefined maximums for each select line and/or for the aggregate of select lines.

In operation 904, system 130 decomposes select logic into a set of select line BDDs. For example, system 130 may be configured to decompose select logic 416 identified in operation 902 into a set of select line BDDs 516a, one for each select line 414 for multiplexer 410 identified in operation 802 of FIG. 8, as described herein. System 130 may be configured to convert one or more decision or logic or operation nodes 718 configured to control a logic state of a select line 714a, 714b into a select line BDD 516a based on, for example, a Shannon expansion of the nodes or groups of nodes and one or more known reduction rules. As described herein, sub-BDDs may be formed or identified to form a predefined library and/or process for converting any portion of select logic 416 into one or more select line BDDs 516a.

For example, in some embodiments, system 130 may be configured to identify multiple copies of the same type of logic and/or operation nodes 718 or groups of logic and/or operation nodes 718 in select logic 716, for example, and decompose those individual nodes 718 or groups into sub-BDDs that can be reused when forming select line BDDs 516a to reduce usage of computational resources. In some embodiments, system 130 may be configured to decompose select logic 716 into select line BDDs 516a using copies of the sub-BDDs to represent the multiple copies of the individual operation nodes or group of operation nodes within the select line BDDs. Similarly, system 130 may be configured to identify shared logic within select logic 716 and decompose the shared logic into one or more sub-BDDs that can be reused when forming select line BDDs 516a to reduce usage of computational resources when synthesizing and/or mapping a multiplexer structure, as described herein. Sub-BDDs may represent any number of nodes or groups of nodes up to the limit of available computing resources.

In operation 906, system 130 identifies irrelevant inputs of a multiplexer based on select line BDDs. For example, system 130 may be configured to identify irrelevant inputs (e.g., data input D5 of FIG. 4, compare FIG. 6) of multiplexer 410 identified in operation 802 of FIG. 8, based on select line BDDs 516a determined in operation 904. In some embodiments, system 130 may be configured to determine a set of select line relations for multiplexer 410, which may be based on, at least in part, the arrangement of select lines 414 for multiplexer 410 relative to other multiplexer substructures, such as one or more substructure multiplexers 411, and/or on how select lines 414 control operation of the other multiplexer substructures. Once the select line relations are determined, the set of select line BDDs 516a determined in operation 904 may be combined according to the select line relations to determine input BDDs 516b for each data input 412 of multiplexer 410, as described herein.

In various embodiments, system 130 may be configured to evaluate each input BDD 516b and identify irrelevant data inputs for multiplexer 410 as those data inputs for which a corresponding input BDD 516b is evaluated as constant zero/logic low. For example, system 130 may be configured to identify the one or more irrelevant inputs by, at least in part, evaluating at least one input BDD 516b as constant zero/logic low, and designating a corresponding data input 412 and/or corresponding circuitry (e.g., interconnections 413, substructure multiplexers 411, select lines 414, select logic inputs 717, operation nodes 718, and/or other multiplexer substructures) as at least one irrelevant input. Once such irrelevant data inputs are identified, system 130 may be configured to then trace the irrelevant data inputs through the user design (e.g., including through design portion 400) to identify additional inputs (e.g., select logic inputs 717) and/or other circuitry that may be eliminated from the user design, as described herein.

By identifying such irrelevant inputs and/or circuitry efficiently, embodiments of the present disclosure are able to reduce the number of PLD components necessary to implement the user design without unreasonably increasing the design processing time and/or otherwise overburdening the computational resources used to synthesize and/or map the user design, as described herein.

While FIGS. 4-9 have been described primarily with reference to multiplexers and/or multiplexer structures with multiple inputs and one output, the methodologies may be applied to differently arranged multiplexers and/or other structures, for example, including to demultiplexers (e.g., a form of multiplexer structures, as described herein). In embodiments where the multiplexer structure includes a demultiplexer, similar analysis of the demultiplexer's select logic (e.g., to determine select line relations, select line BDDs, and corresponding output BDDs) may be used to identify one or more irrelevant outputs (e.g., outputs to which the input of the demultiplexer is never routed) that may be eliminated (terminated/grounded and/or removed) from the user design.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method comprising:
receiving a design identifying operations to be performed by a programmable logic device (PLD);
synthesizing the design into a plurality of PLD components, wherein the synthesizing comprises:
identifying a multiplexer in the design, wherein operation of the multiplexer is controlled by select logic over one or more select lines,
identifying one or more irrelevant inputs for the multiplexer, wherein the identifying the one or more irrelevant inputs comprises:
decomposing the select logic into one or more select line binary decision diagrams (BDDs) corresponding to the one or more select lines,
determining a set of select line relations to the multiplexer based, at least in part, on an arrangement of the one or more select lines relative to other multiplexer substructures of the multiplexer,
combining the one or more select line BDDs according to the select line relations to determine an input BDD for each data input of the multiplexer,
evaluating at least one input BDD as constant logic low, and
designating a corresponding data input and/or corresponding circuitry as at least one irrelevant input, and
generating a reduced multiplexer by eliminating the one or more irrelevant inputs from the multiplexer to reduce the plurality of PLD components;
generating configuration data to configure physical components of the PLD in accordance with the reduced multiplexer for the design; and
storing the configuration data in a machine-readable memory.

2. The method of claim 1, wherein the identifying the one or more irrelevant inputs for the multiplexer further comprises:
estimating a complexity of the multiplexer based, at least in part, on a number of select logic inputs, operational nodes, and/or the one or more select lines of the multiplexer; and
determining that the estimated complexity is equal to or greater than a predetermined value,
wherein the decomposing is in response to determining that the estimated complexity is equal to or greater than the predetermined value.

3. The method of claim 1, wherein the multiplexer is a first multiplexer, wherein the synthesizing further comprises:
identifying a second multiplexer in the design;
estimating a complexity of the second multiplexer based, at least in part, on a number of select logic inputs, operational nodes, and/or select lines of the second multiplexer;
determining that the estimated complexity is less than a predetermined value; and
identifying one or more irrelevant inputs for the second multiplexer by exhaustive search.

4. The method of claim 1, wherein the identifying the one or more irrelevant inputs for the multiplexer further comprises:
identifying the select logic for the multiplexer by tracing the one or more select lines through the design to one or more select logic inputs.

5. The method of claim 4, wherein the identifying the select logic for the multiplexer comprises:
limiting the identified select logic by tracing the one or more select lines through the design up to a predefined maximum number of select logic inputs and/or operation nodes for each select line and/or for all select lines in aggregate.

6. The method of claim 1, wherein the identifying the one or more irrelevant inputs for the multiplexer further comprises:
identifying multiple copies of a type of operation node or group of operation nodes in the select logic; and
decomposing the types of operation node or group of operation nodes into a sub-BDD,
wherein the select logic is decomposed into the one or more select line BDDs using copies of the sub-BDD to represent the multiple copies of the type of operation node or group of operation nodes within the select line BDDs.

7. The method of claim 1, wherein the identifying the one or more irrelevant inputs for the multiplexer further comprises:
identifying shared logic in the select logic; and
decomposing the shared logic into a sub-BDD,
wherein the select logic is decomposed into the one or more select line BDDs using copies of the sub-BDD to represent the shared logic within the select line BDDs.

8. The method of claim 1, wherein the generating the reduced multiplexer comprises:
eliminating the one or more irrelevant inputs from the multiplexer by terminating, grounding, or removing the one or more irrelevant inputs and/or one or more corresponding multiplexer substructures in the design.

9. The method of claim 1, further comprising:
programming the PLD with the configuration data.

10. A system comprising:
a processor; and
a memory adapted to store a plurality of computer readable instructions which when executed by the processor are adapted to cause the system to perform a method comprising:
identifying a multiplexer in a design designating operations to be performed by a programmable logic device (PLD), wherein operation of the multiplexer is controlled by select logic over one or more select lines, identifying one or more irrelevant inputs for the multiplexer, wherein the identifying the one or more irrelevant inputs comprises:
    decomposing the select logic into one or more select line binary decision diagrams (BDDs) corresponding to the one or more select lines,
    determining a set of select line relations to the multiplexer based, at least in part, on an arrangement of the one or more select lines relative to other multiplexer substructures of the multiplexer,
    combining the one or more select line BDDs according to the select line relations to determine an input BDD for each data input of the multiplexer,
    evaluating at least one input BDD as constant logic low, and
    designating a corresponding data input and/or corresponding circuitry as at least one irrelevant input,
generating a reduced multiplexer by eliminating the one or more irrelevant inputs from the multiplexer, and
generating configuration data to configure physical components of the PLD in accordance with the reduced multiplexer for the design.

11. The system of claim 10, wherein the identifying the one or more irrelevant inputs for the multiplexer further comprises:
    estimating a complexity of the multiplexer based, at least in part, on a number of select logic inputs, operational nodes, and/or the one or more select lines of the multiplexer; and
    determining that the estimated complexity is equal to or greater than a predetermined value,
    wherein the decomposing is in response to determining that the estimated complexity is equal to or greater than the predetermined value.

12. The system of claim 10, wherein the multiplexer is a first multiplexer, wherein the method further comprises:
    identifying a second multiplexer in the design;
    estimating a complexity of the second multiplexer based, at least in part, on a number of select logic inputs, operational nodes, and/or select lines of the second multiplexer;
    determining that the estimated complexity is less than a predetermined value; and
    identifying one or more irrelevant inputs for the second multiplexer by exhaustive search.

13. The system of claim 10, wherein the identifying the one or more irrelevant inputs for the multiplexer comprises:
    identifying the select logic for the multiplexer by tracing the one or more select lines through the design to one or more select logic inputs.

14. The system of claim 13, wherein the identifying the select logic for the multiplexer comprises:
    limiting the identified select logic by tracing the one or more select lines through the design up to a predefined maximum number of select logic inputs and/or operation nodes for each select line and/or for all select lines in aggregate.

15. The system of claim 10, wherein the identifying the one or more irrelevant inputs for the multiplexer comprises:
    identifying multiple copies of a type of operation node or group of operation nodes in the select logic; and
    decomposing the types of operation node or group of operation nodes into a sub-BDD,
    wherein the select logic is decomposed into the one or more select line BDDs using copies of the sub-BDD to represent the multiple copies of the type of operation node or group of operation nodes within the select line BDDs.

16. The system of claim 10, wherein the identifying the one or more irrelevant inputs for the multiplexer comprises:
    identifying shared logic in the select logic; and
    decomposing the shared logic into a sub-BDD,
    wherein the select logic is decomposed into the one or more select line BDDs using copies of the sub-BDD to represent the shared logic within the select line BDDs.

17. The system of claim 10, wherein the generating the reduced multiplexer comprises:
    eliminating the one or more irrelevant inputs from the multiplexer by terminating, grounding, or removing the one or more irrelevant inputs and/or related circuitry in the design.

18. The system of claim 10, wherein the method further comprises:
    receiving the design;
    synthesizing the design into a reduced plurality of PLD components prior to routing the design; and
    programming the PLD with the configuration data.

19. The method of claim 1,
    wherein the one or more irrelevant inputs have no effect on an output of the multiplexer.

20. The system of claim 10, wherein the one or more irrelevant inputs have no effect on an output of the multiplexer.

* * * * *